(12) United States Patent
Clements et al.

(10) Patent No.: US 7,705,640 B2
(45) Date of Patent: Apr. 27, 2010

(54) COMMON-MODE FEEDBACK METHOD USING A CURRENT STARVED REPLICA BIASING

(75) Inventors: Steven M. Clements, Raleigh, NC (US); Todd M. Rasmus, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 12/019,748

(22) Filed: Jan. 25, 2008

(65) Prior Publication Data

US 2009/0189654 A1    Jul. 30, 2009

(51) Int. Cl.
*H03L 7/06* (2006.01)
(52) U.S. Cl. .................. 327/157; 327/147; 327/156; 327/158
(58) Field of Classification Search .................. 327/147, 327/156, 157, 158
See application file for complete search history.

(56) References Cited

U.S. PATENT DOCUMENTS

2002/0041215 A1* 4/2002 Kiyose ..................... 331/57
2005/0185746 A1* 8/2005 Jung .......................... 375/374

* cited by examiner

*Primary Examiner*—Lincoln Donovan
*Assistant Examiner*—John W Poos
(74) *Attorney, Agent, or Firm*—Dillon & Yudell LLP

(57) ABSTRACT

A method, system, and circuit design product for setting the common-mode voltage level of a charge pump to yield low duty cycle distortion from a voltage controlled oscillator (VCO). Differential charge pumps utilize common-mode feedback (CMF) networks to control the common-mode voltage level. A replica circuit of a current starved delay cell from a VCO replaces the unity gain buffering circuit within a common-mode feedback circuit. Inserting the current starved delay cell replica circuit permits adequate negative feedback compensation, while allowing a phase locked loop (PLL) to operate with a wide bandwidth. As a result of utilizing the replica circuit of a current starved delay cell from a VCO, the common-mode voltage level is optimally centered to interface with the VCO, thereby minimizing duty cycle distortion.

19 Claims, 4 Drawing Sheets

COMMON-MODE FEEDBACK METHOD USING A CURRENT STARVED REPLICA BIASING

BACKGROUND

1. Technical Field

The present invention generally relates to phase locked loops and in particular to differential charge pumps in phase-locked loop circuits.

2. Description of the Related Art

When phase locked loops (PLLs) are required to produce multiple output phases, the duty cycle distortion should remain low for the outputs. Commonly, PLLs implement differential charge pumps that provide adequate noise immunity and exhibit the least sensitivity to supply voltage movement. Such differential designs incorporate the use of negative feedback to set and/or control the common-mode voltage level delivered to the voltage control oscillator (VCO) input. Certain types of VCOs, such as current starved delay VCOs, require a differential voltage interface with a tightly controlled common-mode voltage level for proper operation and low duty cycle distortion.

Often, the low pass filter (LPF) which connects to the charge pump's output also serves as the compensation network for the common mode feedback loop. However, the LPF has difficulty satisfying the stability requirements of the charge pump's common-mode feedback loop, while allowing the global PLL loop bandwidth to be high. The complications derive from multiple 'poles' residing in the charge pump common mode feedback loop. These poles originate from the LPF and the common-mode buffering circuits.

Buffering circuits utilized in PLLs present 'poles' to the charge pump's common mode feedback. When the LPF is the compensation network for the charge pump's common-mode feedback, a wide bandwidth PLL's low pass filter presents stability problems. The stability problems are a result of the additional buffer poles. Charge pumps require common-mode feedback networks to control the common-mode voltage level. Without optimizing the common-mode voltage level, the VCO output may not yield the desired duty cycle duty cycle.

SUMMARY OF ILLUSTRATIVE EMBODIMENTS

Disclosed are a method, system, and circuit design for setting the common-mode voltage level of a charge pump to yield low duty cycle distortion from a voltage controlled oscillator (VCO). Differential charge pumps utilize common-mode feedback (CMF) networks to control the common-mode voltage level. A replica circuit of a current starved delay cell from a VCO replaces the unity gain buffering circuit within a common-mode feedback circuit. Inserting the current starved delay cell replica circuit permits adequate common-mode feedback correction, while allowing a phase locked loop (PLL) to operate with a wide bandwidth. As a result of utilizing the replica circuit of a current starved delay cell, the common-mode voltage level is optimally centered to interface with the VCO, thereby minimizing duty cycle distortion.

The above as well as additional features of the present invention will become apparent in the following detailed written description.

BRIEF DESCRIPTION OF THE DRAWINGS

The invention itself will best be understood by reference to the following detailed description of an illustrative embodiment when read in conjunction with the accompanying drawings, wherein.

DETAILED DESCRIPTION OF AN ILLUSTRATIVE EMBODIMENT

Figure 1:
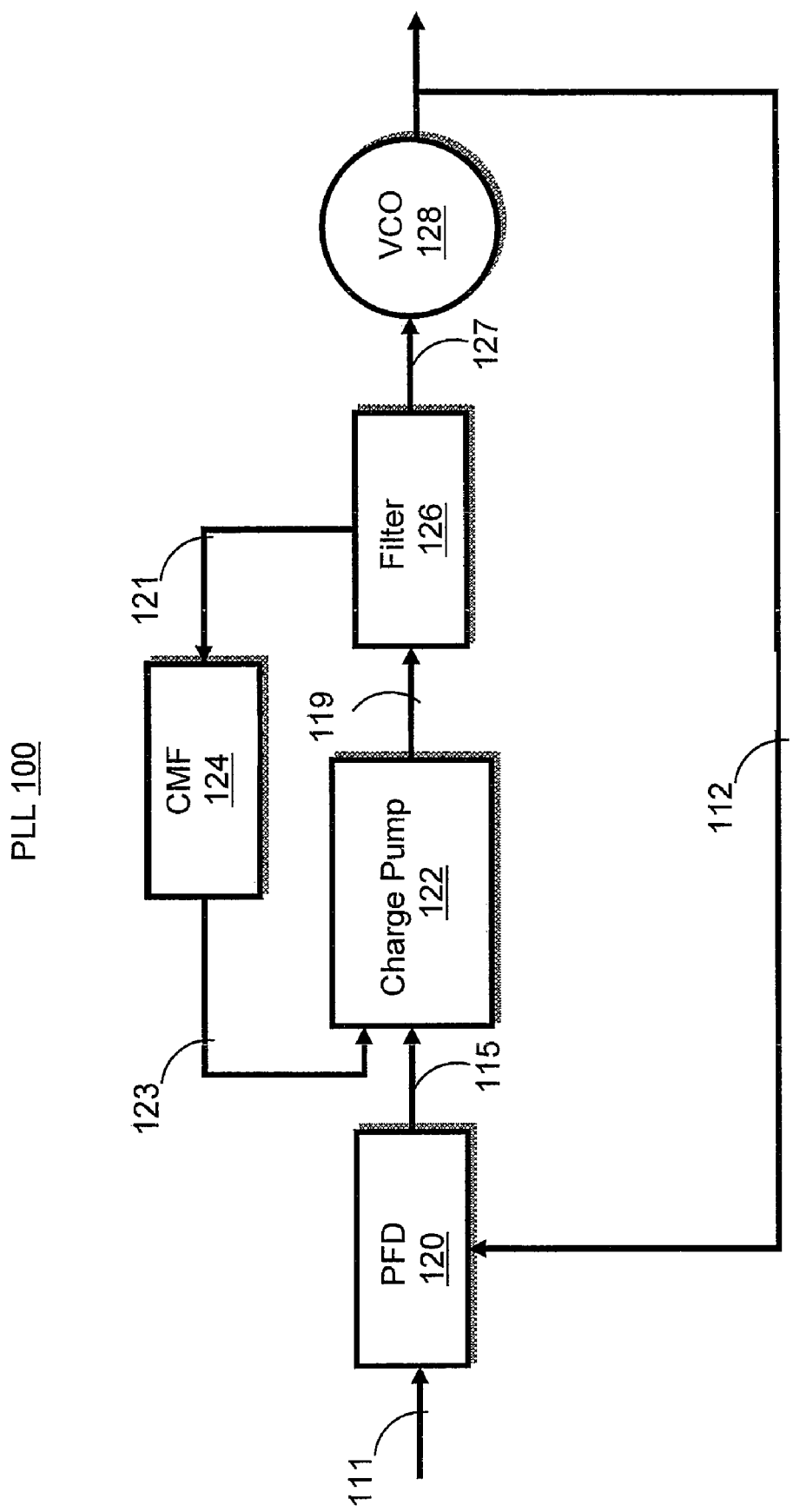
FIG. 1 is a block diagram of a phase locked loop utilizing a charge pump with common-mode feedback, according to one embodiment of the invention.

The illustrative embodiments provide a method, system, and circuit design for setting the common-mode voltage level of a charge pump to yield low duty cycle distortion from a voltage controlled oscillator (VCO). Differential charge pumps utilize common-mode feedback (CMF) networks to control the common-mode voltage level. A replica circuit of a current starved delay cell from a VCO replaces the unity gain buffering circuit within a common-mode feedback circuit. Inserting the current starved delay cell replica circuit permits adequate common-mode feedback correction, while allowing a phase locked loop (PLL) to operate with a wide bandwidth. As a result of utilizing the replica circuit of a current starved delay cell, the common-mode voltage level is optimally centered to interface with the VCO, thereby minimizing duty cycle distortion.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

Within the descriptions of the figures, similar elements are provided similar names and reference numerals as those of the previous figure(s). Where a later figure utilizes the element in a different context or with different functionality, the element is provided a different leading numeral representative of the figure number (e.g, 1xx for FIG. 1 and 2xx for FIG. 2). The specific numerals assigned to the elements are provided solely to aid in the description and not meant to imply any limitations (structural or functional) on the invention.

It is understood that the use of specific component, device and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that terms is utilized.

With reference now to the figures, FIG. 1 depicts a block diagram representation of a phase locked loop (PLL) system. PLL 100 comprises a phase frequency detector (PFD) 120, charge pump 122, common-mode feedback (CMF) circuit 124, filter 126, and voltage controlled oscillator (VCO) 128. PFD 120 includes receives inputs of reference clock signal 111 and a second feedback signal 112. The output 115 of PFD 120 is coupled to the input of charge pump 122. Charge pump differential output signal 119 is input into filter 126, which provides VCO input 127 to VCO 128.

Filter 126 also provides CMF input 121 to CMF circuit 124. CMF circuit 124 determines the common-mode voltage of charge pump differential output signal 119, and compares the common-mode voltage to a reference voltage. The difference of the common-mode voltage and a reference voltage (provided by the common-mode feedback circuit) is output from common-mode feedback circuit 124 and input to charge pump 122, as common-mode feedback signal 123. When common-mode feedback signal 123 is provided to charge pump 122, charge pump 122 may modify the common-mode voltage level, and provide an improved charge pump differential output signal 119. VCO output is fed back to PFD 120 as second feedback signal 112.

Figure 2:
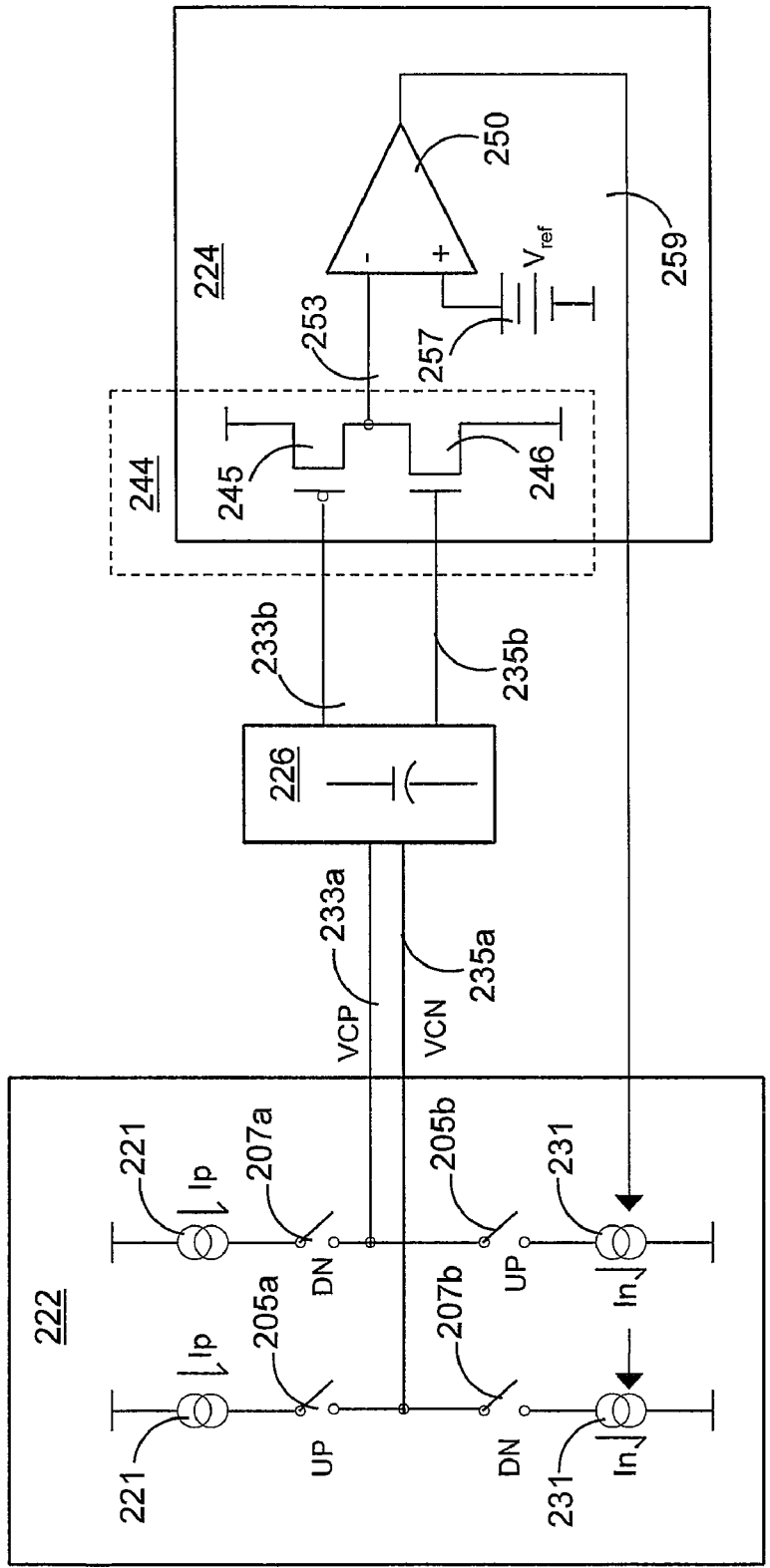
FIG. 2 is a block diagram of a charge pump and common-mode feedback circuit utilizing a delay cell circuit of a current starved voltage controlled oscillator, in accordance with one embodiment of the invention.

With reference now to FIG. 2, there is illustrated an example CMF network, according to one embodiment. CMF network 200 comprises charge pump circuit 222, filter 226, and CMF circuit 224. The circuit of charge pump 222 includes two pairs of differential switches: up switch A 205*a* and up switch B 205*b*, and down switch A 207*a* and down switch B 207*b*. Charge pump 222 produces a differential output: positive voltage control signal (VCP) 233*a* and negative voltage control signal VCN 235*a*. Positive current sources (Ip) 221 and negative current sources (In) 231 are also present in charge pump 222. CMF circuit 224 comprises replica circuit 244 which includes PMOS (p-type) transistor 245 and NMOS (n-type) transistor 246, and amplifier 250 which outputs charge pump feedback correction signal 259. Amplifier 350 has two inputs: a positive amplifier input signal of reference voltage (Vref) 257, and negative amplifier input voltage (referred to as sensed common mode voltage) 253.

In one embodiment, up switch A 205*a*, up switch B 205*b*, down switch A 207*a*, and down switch B 207*b* are utilized by the charge pump to provide VCP 233*a* and VCN 235*a*. Up switch A 205*a*, up switch B 205*b*, down switch A 207*a*, and down switch B 207*b* perform the operation of switching current sources Ip 221 and In 231 to the differential voltage signal comprised of VCP 233*a* and filtered VCN 235*a*. Charge pump 222 provides the differential voltage input signal comprised of filtered VCP 233*b* and filtered VCN 235*b* to CMF circuit 224 via filter 226. Filtered VCP 233*b* and filtered VCN 235*b* are input into p-type transistor 245 and n-type transistor 246, respectively.

In one embodiment, CMF circuit 224 is a replica circuit of a voltage controlled oscillator's current starved delay cell. Replica circuit 244, comprising p-type transistor 245 and n-type transistor 246, allows CMF circuit 224 to provide a differential control voltage with optimal common mode centering to a ring based VCO, such as VCO 128 (FIG. 1). CMF circuit 224 determines the common-mode voltage of the differential voltage between filtered VCP 233*b* and filtered VCN 235*b*, and compares the sensed common-mode voltage level (253) to Vref 257. The difference between the sensed common-mode voltage level (253) and Vref 257 is output by amplifier 250 as charge pump feedback correction signal 259. Charge pump feedback correction signal 259 is provided to charge pump 222, and allows charge pump 222 to modify the charge pump signals, VCP 233*a* and VCN 235*a*.

In one embodiment, when the common-mode voltage level is high, replica circuit 224 causes negative amplifier input (i.e., sensed common-mode voltage level) 253 to be low (i.e., too low relative to Vref 257); thereby, charge pump feedback correction signal 259 transitions to a higher output. When charge pump feedback correction signal 259 transitions to a higher output, charge pump 222 sinks an increased amount of In 231. Sinking an increased amount of In 231, within charge pump 222, pulls the common-mode voltage to a lower voltage level. Charge pump 222 continues to receive real-time feedback (via charge pump feedback correction signal 259) until the output of replica circuit 244 yields a positive amplifier input voltage 253 equivalent to Vref 257.

In one embodiment, when the common-mode voltage level is low, replica circuit 224 causes negative amplifier input 253 to be high (i.e., too high relative to Vref 257), thereby, charge pump feedback correction signal 259 transitions to a lower output. When charge pump feedback correction signal 259 transitions to a lower output, charge pump 222 sinks a decreased amount of In 231. Sinking less In 231 within charge pump 222 pulls the common-mode voltage to a higher voltage level. Charge pump 222 continues to receive real-time feedback (via charge pump feedback signal 259) until the output of replica circuit 244 yields a negative amplifier input voltage 253 equivalent to Vref 257.

In one embodiment, replica circuit 244 is a replica of a VCO's current starved delay cell. Replica circuit 244 receives the differential voltage pair (of signals) as inputs and determines an optimal (measured) common-mode voltage level to satisfy the VCO. P-type transistor 245 and n-type transistor 246, within replica circuit 244, share the same transistor shape ratio, whereby p-type transistor 245 is equal to the dividend of the width (W) and length (L) of the transistor, multiplied by "K", where "K" is a constant and a factor of the device (transistor) parameters (i.e., p-type ratio=K*(W/L)). The n-type transistor ratio is equivalent to the dividend of the width and length of the transistor (n-type ratio=W/L).

Figure 3:
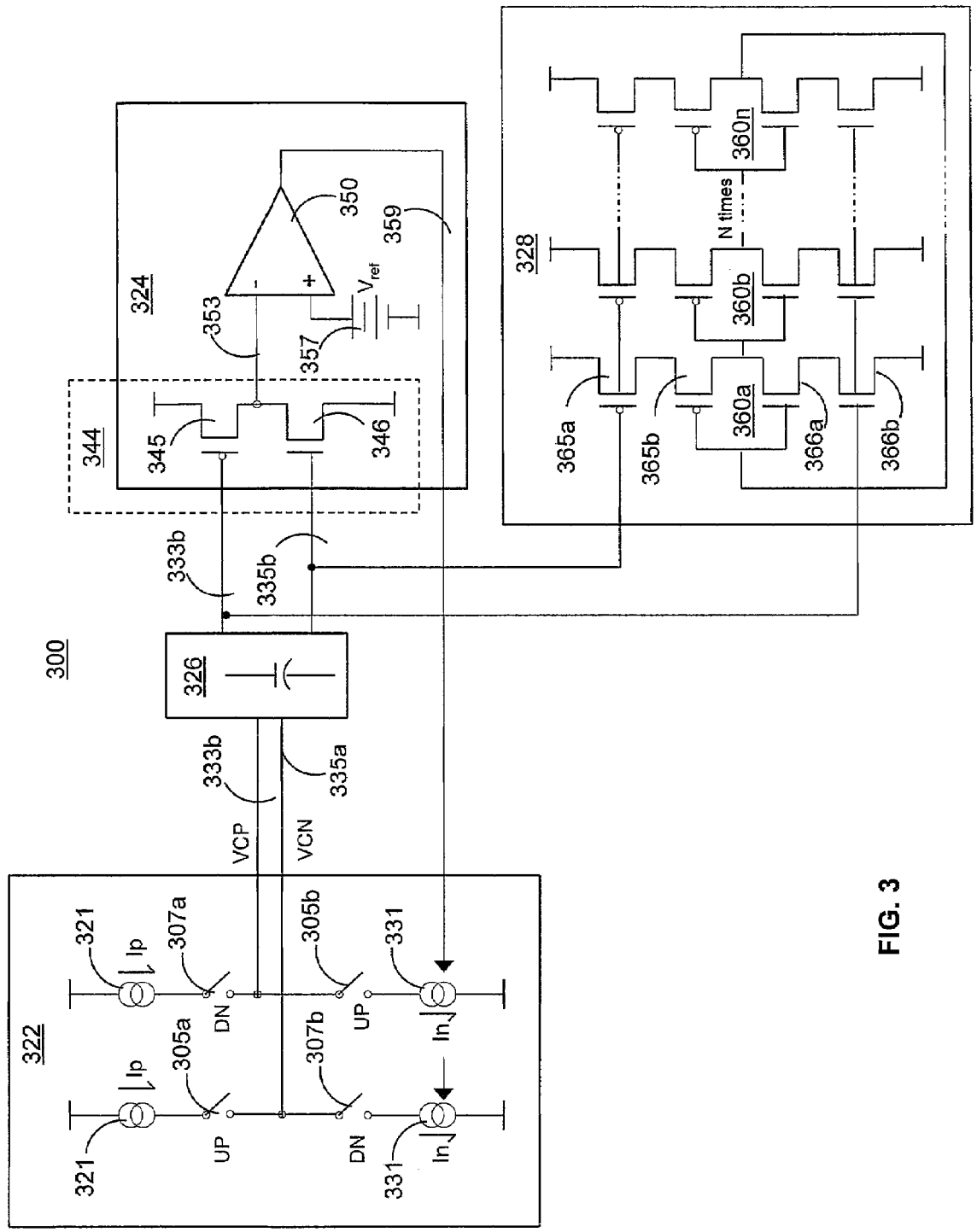
FIG. 3 is a block diagram of a charge pump and common-mode feedback circuit connected to a current starved voltage controlled oscillator circuit, according to one embodiment of the invention.

FIG. 3 illustrates CMF and VCO network 300 comprising charge pump circuit 322, filter 326, CMF circuit 324, and current starved ring VCO 328. The circuit of charge pump 322 includes two pair of differential switches: up switch A 305*a* and up switch B 305*b*, and down switch A 307*a* and down switch B 307*b*. Charge pump 322 produces differential outputs: VCP 333*a* and VCN 335*a*. Positive current sources (Ip) 321 and negative current sources (In) 331 are also present in charge pump 322. CMF circuit 324 comprises replica circuit 344 which includes p-type transistor 345 and n-type transistor 346, and amplifier 350 which outputs common-mode feedback 359. Amplifier 350 provides an output signal of charge pump feedback correction signal 359, and receives two input signals: a positive input signal of Vref 357 and negative amplifier input voltage (i.e., the sensed common-mode voltage of the replica) 353.

Filtered VCP 233*b* and filtered VCN 235*b* are input into p-type transistor 365*a* and n-type transistor 366*b* of current starved ring VCO 328. VCO 328 comprises a pair of p-type transistors 365*a* and 365*b* in series with a pair of n-type transistors 366*a* and 366*b*. Current starved ring VCO 328 may comprise n (variable) number of transistor stages 360*a*, 360*b*, and 360*n*, each composed of a pair of p-type transistors 365*a* and 365*b* in series with a pair of n-type transistor 366*a* and 366b. The input of p-type transistor 365b and the input of n-type transistor 366a are coupled together.

In one embodiment, up switch A 305a, up switch B 305b, down switch A 307a, and down switch B 307b are utilized by the charge pump to provide filtered VCP 333b and filtered VCN 335b to current starved ring VCO 328 and CMF circuit 324 via filter 326. Filtered VCP 333b and filtered VCN 335b are input into p-type transistor 345, n-type transistor 346 of CMF circuit 324, and input into p-type transistor 365a and n-type transistor 366b of VCO 328.

In one embodiment, CMF circuit 324 is a replica circuit of a current starved delay cell from current starved ring VCO 328. Replica circuit 344, comprising p-type transistors 345 and n-type transistor 346 connected in series, allow optimal common mode centering with current starved ring VCO 328, thereby reducing duty cycle distortion. Inserting replica circuit 344 permits adequate compensation of the common-mode feedback network, while allowing a PLL (such as PLL 100 of FIG. 1) to operate with a wide bandwidth.

Figure 4:
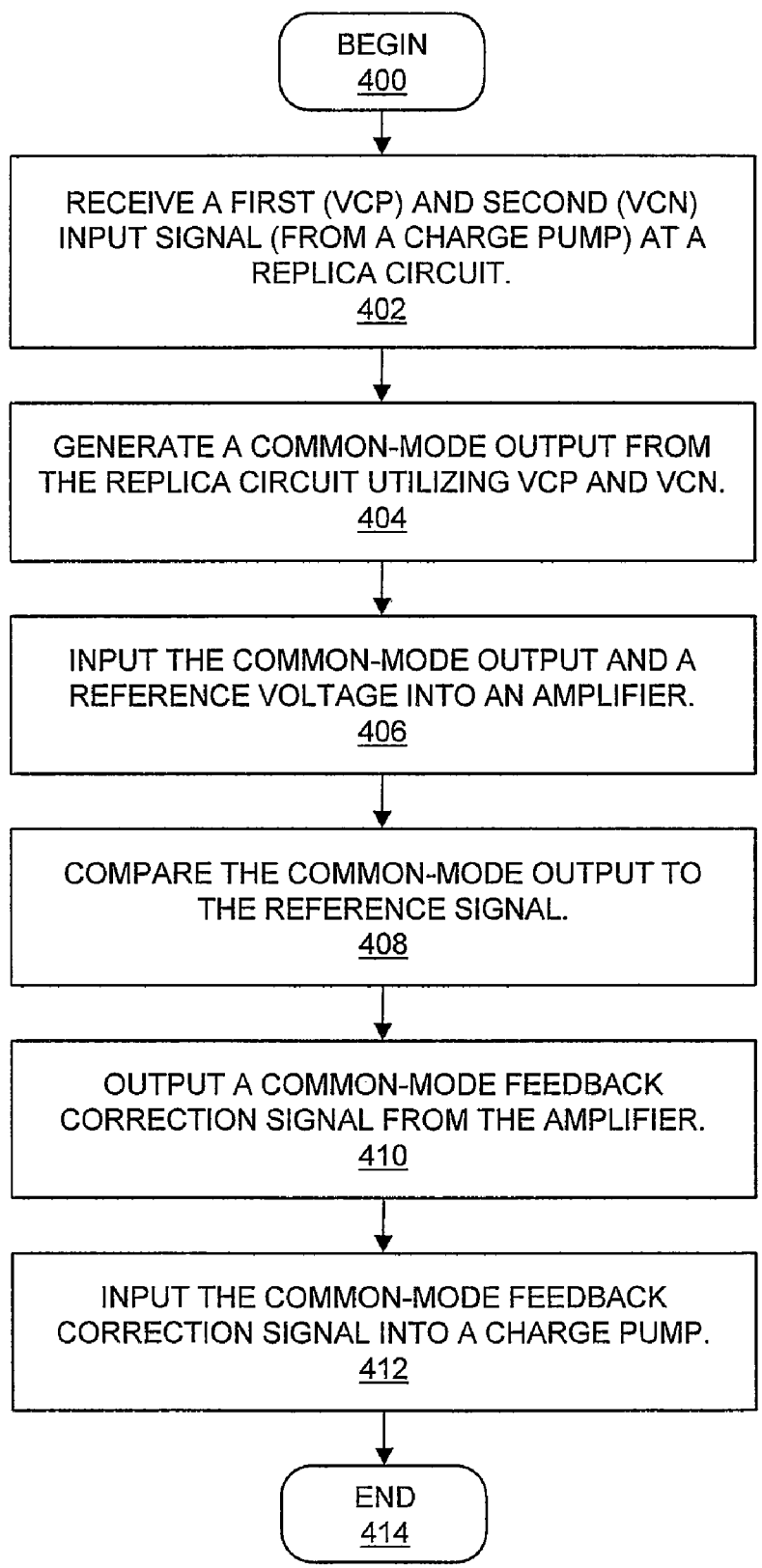
FIG. 4 is a logic flow chart for the method of setting the common-mode voltage level of a charge pump to yield low duty cycle distortion for VCO, in accordance with one embodiment of the invention.

FIG. 4 is a flow chart illustrating the method for setting the common-mode voltage level of a charge pump to yield low duty cycle distortion for a VCO. The process of FIG. 4 begins at initiator block 400 and proceeds to block 402, at which a first (VCP) and second (VCN) input signal, from a charge pump (222), are received at replica circuit 224 (of FIG. 2). A sensed common-mode voltage signal/output is generated by the replica circuit, at block 404, utilizing VCP and VCN. This signal represents the optimal common mode voltage for the VCO. At block 406, the sensed common-mode voltage signal (from the replica circuit) and a reference voltage are input into an amplifier. The sensed common-mode voltage signal and reference voltage are compared utilizing the amplifier, at block 408. At block 410, a charge pump feedback correction signal is output from the amplifier. The charge pump feedback correction signal is then input into the charge pump (222). The process ends at block 414.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. An electrical circuit comprising:
   a charge pump sub-circuit that generates a common-mode voltage level and which provides a differential pair of outputs;
   a filter component coupled to the differential pair of outputs and generating a filtered pair of outputs;
   a voltage controlled oscillator component (VCO) coupled to the filtered pair of outputs; and
   a common-mode feedback circuit also coupled to the filtered pair of outputs and which generates a charge pump feedback correction signal to the charge pump sub-circuit to optimally center the common mode voltage;
   wherein the common mode feedback circuit comprises a first transistor connected in series with a second transistor to form a replica circuit, wherein each transistor receives a gate voltage from a respective one of the filtered pair of outputs.

2. The electrical circuit of claim 1, wherein the common mode feedback circuit further comprises:
   an amplifier with a first input coupled to a node connecting the first transistor to the second transistor and a second input coupled to a reference voltage, wherein the series-connection of the first transistor and the second transistor generates a sensed common-mode voltage signal to the first input of the amplifier;
   wherein the common mode feedback circuit is a replica circuit of the VCO; and
   wherein the charge pump feedback correction signal is an output of the amplifier, which output is coupled to the charge pump sub-circuit.

3. The electrical circuit of claim 1, wherein:
   the first transistor is a first type transistor and the second transistor is a second type transistor from among a p-type transistor and an n-type transistor;
   wherein the first transistor width to length ratio is a constant K times greater than the second transistor; and
   a first filtered voltage applied to the gate of the first transistor and a second filtered voltage applied to the gate of the second transistor is (a) a positive complement differential leg voltage when the transistor is a p-type transistor and (b) a negative complement differential leg voltage when the transistor is a n-type transistor.

4. The electrical circuit of claim 1, wherein the differential pair of outputs generated by the charge pump sub-circuit includes a positive voltage output on a first output signal path and a negative voltage output on a second output signal path.

5. The electrical circuit of claim 1, wherein the VCO is a current starved ring VCO and comprises:
   one or more sets of series-connected transistors, wherein a first set includes a first transistor of a first type and a second transistor of a second type, which transistors respectively receives a first filtered output and a second filtered output from the pair of filtered outputs as a respective gate voltage; and
   a middle pair of transistors connecting the first transistor and the second transistor to form the first set, wherein gates of the middle pair of transistors are joined at a common node to receive an output of the one or more sets of series-connected transistors as a respective gate voltage.

6. The electrical circuit of claim 5, wherein the common mode feedback circuit provides the functionality of:
   receiving a first filtered signal and a second filtered signal as inputs to a replica circuit;
   dynamically generating a sensed common-mode voltage as an output signal from the replica circuit;
   determining the charge pump feedback signal by comparing the output signal from the replica circuit to a reference voltage; and
   outputting the charge pump feedback signal to the charge pump.

7. The electrical circuit of claim 6, wherein said receiving functionality includes:
   coupling the first signal to a first transistor, wherein when the first signal is a positive voltage control signal (VCP), the first transistor is a p-type transistor;
   coupling the second signal to a second transistor, wherein when the second signal is a negative voltage control signal (VCN), the second transistor is a n-type transistor; and outputting the output signal of the replica circuit from a node coupling a drain of the p-type transistor and a drain of the n-type transistor, wherein the drain of the p-type transistor and the drain of the n-type transistor are connected in series.

8. The electrical circuit of claim 7, said common mode feedback circuit further providing the functionality of:
inputting the output signal into a negative input of the amplifier;
inputting the reference voltage into a positive input of the amplifier;
comparing the output signal to the reference voltage; and
determining the charge pump feedback signal based on the difference between the output signal and the reference voltage.

9. The electrical circuit of claim 6, wherein said functionality of dynamically generating the differential signal as an output signal further provides:
generating a higher charge pump feedback correction signal when the common-mode voltage level of the charge pump is high;
outputting a lower sensed common-mode signal from the replica circuit when the common-mode level of the VCP and VCN input signals to the replica circuit is high;
inputting the lower sensed common-mode signal into the negative input of the amplifier and comparing the lower sensed common-mode signal to the reference voltage that is provided at the positive input of the amplifier;
outputting a higher charge pump feedback correction signal from the amplifier, wherein the higher charge pump feedback correction signal is input into the charge pump;
decreasing the high common-mode voltage level when the charge pump receives the higher charge pump feedback correction signal; and
deterministically generating the charge pump feedback correction signal until the differential output signal equals the reference voltage.

10. The electrical circuit of claim 6, wherein said functionality of dynamically generating the differential signal as an output signal further comprises:
generating a lower common-mode feedback correction signal when the sensed common-mode voltage level of the charge pump is low;
outputting a higher sensed common-mode signal from the replica circuit, when the common-model level of the VCP and VCN input signals to the replica circuit is low;
inputting the higher sensed common-mode signal into the negative input of the amplifier and comparing the higher sensed common mode signal to the reference voltage that is provided at the positive input of the amplifier;
outputting a lower charge pump feedback correction signal from the amplifier, wherein the lower charge pump feedback correction signal is input into the charge pump;
increasing the low common-mode voltage level when the charge pump receives the low charge pump feedback correction signal; and
deterministically generating the charge pump feedback correction signal until the differential output signal equals the reference voltage.

11. The electrical circuit of claim 1, configured to provide a phase locked loop (PLL).

12. In an electrical circuit having a charge pump component that generates a common-mode voltage level, a filter component that receives a differential output of the charge pump component and generates a first and a second filtered output signals, and a voltage controlled oscillator (VCO) component that receives the first and the second filtered output signals as inputs to the VCO, a method comprising:
coupling a common-mode feedback circuit to the first and second filtered output signals, as a replica circuit, wherein said common-mode feedback circuit generates a charge pump feedback correction signal that is fed to the charge pump to enable a phase locked loop of the electrical circuit to operate with a wide bandwidth, while minimizing duty cycle distortion;
wherein the common mode feedback circuit comprises a first transistor connected in series with a second transistor to form a replica circuit, wherein each transistor receives a gate voltage from a respective one of the filtered pair of outputs.

13. The method of claim 12, wherein the common-mode feedback circuit further comprises:
an amplifier with a first input coupled to a node connecting the first transistor to the second transistor and a second input coupled to a reference voltage, wherein the series-connection of the first transistor and the second transistor generates a sensed common mode voltage signal to the first input of the amplifier;
wherein the common mode feedback circuit is a replica circuit of the VCO; and
wherein the charge pump feedback correction signal is an output of the amplifier, which output is coupled to the charge pump sub-circuit.

14. The method of claim 12, wherein:
the first transistor is a first type transistor and the second transistor is a type transistor from among a p-type transistor and an n-type transistor;
wherein the first transistor width to length ratio is a constant K times greater than the second transistor; and
a first filtered voltage applied to the gate of the first transistor and a second filtered voltage applied to the gate of the second transistor is a positive complement differential leg voltage when the transistor is a p-type transistor and a negative compliment differential leg voltage when the transistor is a n-type transistor.

15. The method of claim 12, further comprising:
receiving a first filtered signal and a second filtered signal as inputs to the replica circuit;
dynamically generating a sensed common-mode voltage signal as an output signal from the replica circuit;
determining the common-mode feedback correction signal by comparing the output signal from the replica circuit to a reference voltage; and
outputting the charge pump feedback correction signal to the charge pump.

16. The method of claim 12, wherein said coupling further comprises:
coupling the first signal to a first transistor, wherein when the first signal is a positive voltage control signal (VCP), the first transistor is a p-type transistor;
coupling the second signal to a second transistor, wherein when the second signal is a negative voltage control signal (VCN), the second transistor is a n-type transistor; and
outputting the output signal of the replica circuit from a node coupling a drain of the p-type transistor and a drain of the n-type transistor, wherein the drain of the p-type transistor and the drain of the n-type transistor are connected in series.

17. The method of claim 15, further comprising:
inputting the output signal into a negative input of the amplifier;

inputting the reference voltage into a positive input of the amplifier;

comparing the output signal to the reference voltage; and determining the charge pump feedback correction signal based on the difference between the output signal and the reference voltage.

18. The method of claim 15, wherein dynamically generating the sensed common mode voltage signal as the output signal further comprises:

generating a higher charge pump feedback correction signal when the common-mode voltage level of the charge pump is high;

outputting a lower sensed common-mode signal from the replica circuit when the common-mode level of the VCP and VCN input signals to the replica circuit is high;

inputting the lower sensed common-mode signal into the negative input of the amplifier and comparing the lower sensed common-mode signal to the reference voltage that is provided at the positive input of the amplifier;

outputting a higher charge pump feedback correction signal from the amplifier, wherein the higher charge pump feedback correction signal is input into the charge pump;

decreasing the high common-mode voltage level when the charge pump receives the higher common-mode feedback correction signal; and deterministically generating the charge pump feedback correction signal until the differential output signal equals the reference voltage.

19. The method of claim 15, wherein dynamically generating the differential signal as an output signal further comprises:

generating a lower charge pump feedback correction signal when the common-mode voltage level of the charge pump is low;

outputting a higher sensed common-mode signal from the replica circuit when the common-mode level of the VCP and VCN input signals to the replica circuit is low;

inputting the higher sensed common-mode signal into the negative input of the amplifier and comparing the higher sensed common-mode signal to the reference voltage that is provided at the positive input of the amplifier;

outputting a lower charge pump feedback correction signal from the amplifier, wherein the lower charge pump feedback correction signal is input into the charge pump;

increasing the low common-mode voltage level when the charge pump receives the low charge pump feedback correction signal; and deterministically generating the charge pump feedback correction signal until the differential output signal equals the reference voltage.

* * * * *